United States Patent
Aoki

(10) Patent No.: US 11,460,510 B1
(45) Date of Patent: Oct. 4, 2022

(54) ALL-SOLID-STATE LITHIUM ION SECONDARY BATTERY SYSTEM AND CHARGING DEVICE FOR ALL-SOLID-STATE LITHIUM ION SECONDARY BATTERIES

(71) Applicants: Nissan Motor Co., Ltd., Yokohama (JP); Renault S.A.S., Boulogne-Billancourt (FR)

(72) Inventor: Osamu Aoki, Kanagawa (JP)

(73) Assignees: Nissan Motor Co., Ltd., Yokohama (JP); Renault S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/642,344

(22) PCT Filed: Sep. 13, 2019

(86) PCT No.: PCT/IB2019/001127
§ 371 (c)(1),
(2) Date: Mar. 11, 2022

(87) PCT Pub. No.: WO2021/048587
PCT Pub. Date: Mar. 18, 2021

(51) Int. Cl.
*G01R 31/389* (2019.01)
*H01M 10/0525* (2010.01)
(Continued)

(52) U.S. Cl.
CPC ......... *G01R 31/389* (2019.01); *G01R 31/392* (2019.01); *H01M 10/0525* (2013.01);
(Continued)

(58) Field of Classification Search
CPC ..... G01R 31/389; G01R 31/392; H02J 7/005; H02J 7/00712; H01M 10/0525; H01M 10/0585; H01M 10/46; H01M 10/48
(Continued)

(56) References Cited

U.S. PATENT DOCUMENTS

2012/0286793 A1* 11/2012 Kawaoka .......... H01M 10/0562
                                                   324/426
2015/0255998 A1   9/2015 Hasegawa et al.
(Continued)

FOREIGN PATENT DOCUMENTS

JP    H07222369 A    8/1995
JP    2010-080067 A  4/2010
(Continued)

*Primary Examiner* — Nathaniel R Pelton
(74) *Attorney, Agent, or Firm* — Young Basile Hanlon & MacFarlane, P.C.

(57) ABSTRACT

A means for detecting the generation of electrodeposition of metal lithium in an all-solid-state lithium-ion secondary battery in a real-time manner is developed even when charging the battery without depending on the specifications of the battery. A system measures alternate current impedance of an all-solid-state lithium-ion secondary battery when charging the battery, and judges whether electrodeposition of metal lithium has generated in a solid-electrolyte layer forming the battery based on the relationship between the amplitude of the response signal at discharge direction of the impedance and the amplitude of the response signal at charge direction of the impedance.

9 Claims, 7 Drawing Sheets

(51) Int. Cl.
  *H01M 10/48*    (2006.01)
  *G01R 31/392*   (2019.01)
  *H01M 10/46*    (2006.01)
  *H02J 7/00*     (2006.01)
  *H01M 10/0585*  (2010.01)

(52) U.S. Cl.
  CPC ....... *H01M 10/0585* (2013.01); *H01M 10/46* (2013.01); *H01M 10/48* (2013.01); *H02J 7/005* (2020.01); *H02J 7/00712* (2020.01)

(58) Field of Classification Search
  USPC .......................................................... 320/107
  See application file for complete search history.

(56) References Cited

U.S. PATENT DOCUMENTS

2017/0104347 A1    4/2017  Shimonishi et al.
2019/0027784 A1*   1/2019  Nose .................... H01M 4/382

FOREIGN PATENT DOCUMENTS

| | | |
|---|---|---|
| JP | 2012-212513 A | 11/2012 |
| JP | 2017-073331 A | 4/2017 |
| JP | 2019-021515 A | 2/2019 |
| WO | 2010/044437 A1 | 4/2010 |
| WO | 2011/074097 A1 | 6/2011 |
| WO | 2012/077450 A1 | 6/2012 |
| WO | 2014/064750 A1 | 5/2014 |

* cited by examiner

ALL-SOLID-STATE LITHIUM ION SECONDARY BATTERY SYSTEM AND CHARGING DEVICE FOR ALL-SOLID-STATE LITHIUM ION SECONDARY BATTERIES

TECHNICAL FIELD

The present invention relates to an all-solid-state lithium ion secondary battery system and a charging device for all-solid-state lithium ion secondary batteries.

BACKGROUND

In recent years, in order to cope with global warming, a reduction in amount of carbon dioxide is strongly desired. In the automobile industry, there are increasing expectations for a reduction of carbon dioxide emissions by introduction of electric vehicles (EV) and hybrid electric vehicles (HEV), and development of non-aqueous electrolyte secondary batteries such as secondary batteries for motor driving, which are key to practical application of such vehicles, has been actively conducted.

A secondary battery for motor driving is required to have extremely high output characteristics and high energy as compared with a lithium ion secondary battery for consumer use used in a mobile phone, a notebook computer, and the like. Therefore, a lithium ion secondary battery having the highest theoretical energy among all practical batteries has attracted attention, and is currently being rapidly developed.

Lithium ion secondary batteries that are currently widespread use a combustible organic electrolyte solution as an electrolyte. In such a liquid-type lithium ion secondary battery, safety measures against liquid leakage, short circuit, overcharge, and the like are more strictly required than other batteries.

Therefore, in recent years, research and development on an all-solid-state lithium ion secondary battery (hereinafter also referred to as an "all-solid-state battery") using an oxide-based or sulfide-based solid electrolyte as an electrolyte have been actively conducted. The solid electrolyte is a material mainly made of an ion conductor that enables ion conduction in a solid. Therefore, in an all-solid-state battery, in principle, various problems caused by combustible organic electrolyte solution do not occur unlike the conventional liquid-type lithium ion secondary battery. In general, use of a high-potential and large-capacity positive electrode material and a large-capacity negative electrode material can achieve significant improvement in output density and energy density of a battery. An all-solid-state battery using a sulfide-based material as a positive electrode active material and metal lithium as a negative electrode active material is a promising candidate.

Meanwhile, a negative electrode potential of a lithium ion secondary battery decreases with progress of charging. When the negative electrode potential decreases to be lower than 0V (vs. Li/Li$^+$), metal lithium is precipitated at the negative electrode, and dendrite (dendritic) crystals are precipitated (this phenomenon is also referred to as electrodeposition of metal lithium). When electrodeposition of metal lithium occurs, there is a problem that the deposited dendrite penetrates an electrolyte layer, thereby causing an internal short-circuit of the battery. In addition, in a liquid-type lithium ion secondary battery, there is also a problem that an organic electrolyte solution constituting an electrolyte reacts with highly active dendrite to be reductively decomposed. Meanwhile, in an all-solid-state battery using metal lithium as a negative electrode active material, growth (that is, occurrence of electrodeposition) of the negative electrode active material (metal lithium) is a charge phenomenon. However, when dendrite grows to a solid electrolyte layer due to this electrodeposition, a short circuit or the like may also occur.

In addition, in a lithium ion secondary battery, there is also a problem that an active material layer of an electrode deteriorates due to, for example, local current concentration in the active material layer with progress of charging and discharging, and a capacity of the battery decreases.

For example, a method described in Japanese Patent Application Laid-Open No. 2012-212513 is known as a method for detecting a state of a lithium ion secondary battery such as the presence or absence of electrodeposition or deterioration of metal lithium. Specifically, Japanese Patent Application Laid-Open No. 2012-212513 discloses a method for detecting a state of a lithium secondary battery including discharging the lithium secondary battery until an SOC (State of Charge (Charge Rate)) becomes 10% or less; measuring an impedance (reaction resistance) of the discharged battery; and detecting the state of the battery on the basis of a measured value of the obtained impedance (reaction resistance). According to Japanese Patent Application Laid-Open No. 2012-212513, according to such a state detection method, since the impedance of the battery is measured when the SOC is a predetermined value of 10% or less in a discharge step (the measured value of the impedance greatly changes depending on the presence or absence of lithium precipitation at a negative electrode), a precipitation state of lithium at the negative electrode (deterioration state of the battery) can be easily and accurately detected.

SUMMARY

Detection of a precipitation state of lithium at a negative electrode (deterioration state of a battery) by using the technique described in Japanese Patent Application Laid-Open No. 2012-212513 has a problem that it is necessary to find a threshold value of impedance (reaction resistance) in advance for each specification of the battery. In addition, since occurrence of electrodeposition can be detected only under a specific condition for which a threshold value of impedance (reaction resistance) has been found, there is also a problem that electrodeposition occurring during charging of a battery cannot be detected in real time.

Therefore, an object of the present invention is to provide a means capable of detecting occurrence of electrodeposition of metal lithium in a solid electrolyte layer in real time even during charging regardless of battery specification in an all-solid-state lithium ion secondary battery.

An all-solid-state lithium ion secondary battery system according to an embodiment of the present invention includes: an all-solid-state lithium ion secondary battery; a charger that charges the all-solid-state lithium ion secondary battery; an AC impedance measuring device that measures an AC impedance of the all-solid-state lithium ion secondary battery; and a controller that determines whether or not electrodeposition of metal lithium has occurred in the solid electrolyte layer of the battery. The all-solid-state lithium ion secondary battery includes a power generating element including a positive electrode including a positive electrode active material layer containing a positive electrode active material, a negative electrode including a negative electrode active material layer containing a negative electrode active material containing metal lithium, and a solid electrolyte layer interposed between the positive electrode active material layer and the negative electrode active material layer. The controller determines whether or not electrodeposition of metal lithium has occurred in the solid electrolyte layer based on a relationship between an amplitude of a response signal in a discharge direction and an amplitude of a response signal in a charge direction of an AC impedance measured by the AC impedance measuring device when the charger charges the all-solid-state lithium ion secondary battery A charging device for an all-solid-state lithium ion secondary battery according to another embodiment of the present invention is a charging device for charging an all-solid-state lithium ion secondary battery including a negative electrode active material layer containing a negative electrode active material containing metal lithium. Further, the charging device includes a charger that charges the all-solid-state lithium ion secondary battery, an AC impedance measuring device that measures an AC impedance of the all-solid-state lithium ion secondary battery, and a controller that determines whether or not electrodeposition of metal lithium has occurred in the negative electrode active material layer.

The controller determines whether or not electrodeposition of metal lithium has occurred in the solid electrolyte layer based on a relationship between an amplitude of a response signal in a discharge direction and an amplitude of a response signal in a charge direction of an AC impedance measured by the AC impedance measuring device when the charger charges the all-solid-state lithium ion secondary battery.

According to the present invention, in the all-solid-state lithium ion secondary battery, occurrence of electrodeposition of metal lithium in the solid electrolyte layer can be detected in real time even during charging, regardless of the specification of the battery.

DETAILED DESCRIPTION

Figure 1:
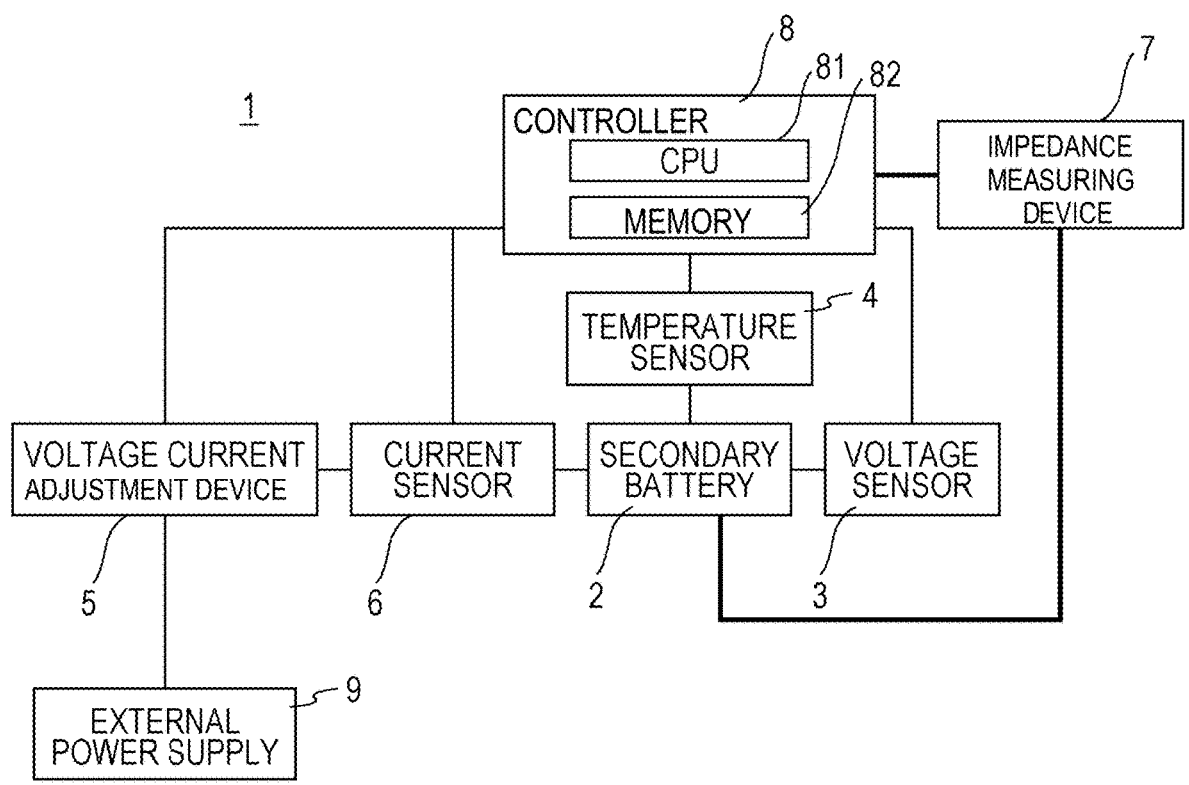
FIG. 1 is a block diagram for explaining a configuration of an all-solid-state lithium ion secondary battery system according to an embodiment of the present invention.

Hereinafter, an embodiment of the present invention described above will be described with reference to the drawings, but the technical scope of the present invention should be determined on the basis of the description of the claims and is not limited only to the following aspects. Hereinafter, the embodiment of the present invention will be described by taking, as an example, a case where a secondary battery is a laminate type (non-bipolar type) all-solid-state battery. Furthermore, the following takes, as an example, a case where an input signal applied from an impedance measuring device to the all-solid-state battery is an alternating current made up of a single frequency component and where impedance of the all-solid-state battery to be measured is an AC impedance (complex impedance). Note that dimensional ratios in the drawings are exaggerated for convenience of description and may be different from actual ratios.

[Secondary Battery System]

FIG. 1 is a block diagram for explaining a configuration of an all-solid-state lithium ion secondary battery system according to an embodiment of the present invention.

The all-solid-state lithium ion secondary battery system (hereinafter also referred to as an "all-solid-state battery system 1") includes an all-solid-state battery 2. Furthermore, the all-solid-state battery system 1 includes a voltage sensor 3 that measures a cell voltage (voltage between terminals) of the all-solid-state battery 2, a temperature sensor 4 that measures an outer surface temperature (environmental temperature) of the all-solid-state battery 2, a voltage current adjustment device 5 that supplies charge power to the all-solid-state battery 2, a current sensor 6 that measures a charge/discharge current of the all-solid-state battery 2, an impedance measuring device 7 that measures impedance of the all-solid-state battery 2 by applying an input signal (alternating current) to the all-solid-state battery 2 and acquiring a response voltage to the input signal, and a controller 8 that controls charging and discharging of the all-solid-state battery 2. The voltage current adjustment device 5 is connected to an external power supply 9 and receives supply of electric power during charging, whereas electric power is discharged to the external power supply 9 side via the voltage current adjustment device 5 during discharging (details will be described later).

Details of each unit will be described below.

The all-solid-state battery 2 is a normal all-solid-state lithium ion secondary battery, and includes a power generating element including a positive electrode including a positive electrode active material layer containing a positive electrode active material capable of occluding and releasing lithium ions, a negative electrode including a negative electrode active material layer containing a negative electrode active material capable of occluding and releasing lithium ions, and a solid electrolyte layer interposed between the positive electrode active material layer and the negative electrode active material layer. Details of the all-solid-state lithium ion secondary battery will be described later.

The voltage sensor 3 may be, for example, a voltmeter, and measures a cell voltage (voltage between terminals) between the positive electrode and the negative electrode of the all-solid-state battery 2. The cell voltage (voltage between terminals) measured while the all-solid-state battery 2 is not energized is an open circuit voltage (OCV) of the all-solid-state battery 2. On the other hand, the cell voltage (voltage between terminals) measured during charging and discharging of the all-solid-state battery 2 is a value changed from the open circuit voltage (OCV) by a voltage drop ($\Delta V = \Delta I \times R$) caused by internal resistance (R) of the all-solid-state battery 2. That is, the voltage sensor 3 can function as an SOC detector or an OCV detector. An attachment position of the voltage sensor 3 is not limited in particular as long as the cell voltage (voltage between terminals) between the positive electrode and the negative electrode can be measured in a circuit connected to the all-solid-state battery 2.

The temperature sensor 4 measures the outer surface temperature (environmental temperature) of the all-solid-state battery 2. The temperature sensor 4 is attached, for example, to a surface of a case (exterior body, housing) of the all-solid-state battery 2. In the present embodiment, the outer surface temperature of the all-solid-state battery 2 is measured as an indication of the temperature of the all-solid-state battery 2. The outer surface temperature is not an accurate indication of an internal temperature but is at least almost the same as a temperature of a single battery layer close to an outermost layer of the all-solid-state battery. In some cases, the controller 8 may estimate the temperature inside the battery according to a predetermined algorithm.

During charging of the all-solid-state battery 2, the voltage current adjustment device 5 adjusts a voltage and a current of power from the external power supply 9 based on a command from the controller 8, and supplies the power to the all-solid-state battery 2. During discharging of the all-solid-state battery 2, the voltage current adjustment device 5 releases electricity discharged from the all-solid-state battery 2 to the external power supply 9. In this manner, the voltage current adjustment device 5, the external power supply 9, and the controller 8, which will be described later, function as a charger that charges the all-solid-state battery 2.

The external power supply 9 is a power supply for an electric vehicle, which is used for charging an electric vehicle or the like and is referred to as a power supply grid or the like, and outputs a direct current. Such a power supply for an electric vehicle converts commercial power (alternating current) into a direct current of a voltage and a current necessary for charging the all-solid-state battery 2 and provides the direct current. Furthermore, the external power supply 9 has a power regeneration function, and can perform regeneration to the commercial power supply by converting a direct current into an alternating current when there is discharge from the all-solid-state battery 2. Note that a known power supply having a power regeneration function may be used as a device constituting such an external power supply 9, and therefore a detailed description thereof is omitted here (examples of a power supply having a power regeneration function include those disclosed in Japanese Patent Application Publication No. 7-222369A and Japanese Patent Application Publication No. 10-080067A, for example).

In a case where the external power supply 9 is not connected to an external power supply device such as a commercial power supply, for example, in a case where the all-solid-state battery 2 is charged while using another secondary battery or the like installed outside as a power supply, power discharged from the all-solid-state battery 2 is preferably stored in the other secondary battery. This can reduce waste of energy.

The current sensor 6 is, for example, an ammeter. The current sensor 6 measures a current value of power supplied from the voltage current adjustment device 5 to the all-solid-state battery 2 during charging of the all-solid-state battery 2, and measures a current value of power supplied from the all-solid-state battery 2 to the voltage current adjustment device 5 during discharging of the all-solid-state battery 2. An attachment position of the current sensor 6 is not limited in particular as long as the current sensor 6 is disposed in a circuit that supplies electric power from the voltage current adjustment device 5 to the all-solid-state battery 2 and can measure a current value during charging and discharging.

The impedance measuring device 7 is configured to measure an AC impedance (complex impedance) of the all-solid-state battery 2 by applying an alternating current as an input signal to the all-solid-state battery 2 and acquiring a response voltage to the alternating current. Conversely, an alternating-current voltage may be applied as an input signal, and a response current may be acquired. In the present embodiment, the input signal is an alternating current made up of a single frequency component.

Any one selected from those conventionally used as a general AC impedance measurement device can be used as the impedance measuring device 7. For example, the impedance measuring device 7 can be one that measures AC impedance of the all-solid-state battery 2 by changing the frequency of an alternating current with time by an AC impedance method. The impedance measuring device 7 may be one that can simultaneously apply a plurality of AC perturbation currents having different frequencies. A method for measuring an AC impedance by the AC impedance method is not limited in particular. For example, a digital method such as a digital Fourier integration method or a fast Fourier transform method by noise application can be appropriately adopted. The frequency of the input signal may be, for example, any value within a range such that a value of an amplitude of a response signal of AC impedance $Z$ measured by the impedance measuring device 7 changes between a discharge direction and a charge direction when electrodeposition occurs in a solid electrolyte layer. An amplitude and the like of a waveform (for example, a sinusoidal wave) of the alternating current applied to the battery are not limited in particular, and can be appropriately set. A measurement result of the AC impedance measured by the impedance measuring device 7 is sent to the controller 8 as an output of the impedance measuring device 7.

The controller 8 is, for example, a computer including a CPU 81, a memory 82, and the like. The controller 8 estimates a state (here, the presence or absence of occurrence of electrodeposition in the solid electrolyte layer of the all-solid-state battery 2) of the all-solid-state battery 2 based on the AC impedance (complex impedance) of the all-solid-state battery 2 measured by the impedance measuring device 7 when performing charging processing on the all-solid-state battery 2 according to a procedure described later. That is, the controller 8 also has a function as a state estimation unit that estimates the state of the all-solid-state battery 2. Furthermore, in the present embodiment, in a case where it is determined that electrodeposition has occurred in the solid electrolyte layer of the all-solid-state battery 2, the controller 8 changes conditions of the charging processing so that the electrodeposition is less likely to proceed (control performed upon electrodeposition detection). As such a controller 8, for example, an electronic controller (ECU) or the like may be used in an electric vehicle.

The memory 82 includes a non-volatile memory in addition to a RAM used as a working area by the CPU 81. The non-volatile memory stores therein a program for performing control for estimating occurrence of electrodeposition in the present embodiment, control performed upon electrodeposition detection, and the like.

[Charging Processing]

A procedure of the charging processing in the secondary battery system 1 configured as described above will be described.

This charging processing is performed in a state where the secondary battery system 1 is connected to the external power supply 9 and charging power can be supplied to the all-solid-state battery 2. In addition, control of the charging processing in the present embodiment uses a constant current constant voltage (CC-CV) charging method in which the charging processing is performed by a constant current charging method until the voltage of the all-solid-state battery 2 reaches a predetermined voltage and is performed by a constant voltage charging method after the voltage of the all-solid-state battery 2 reaches the predetermined voltage.

Figure 2:
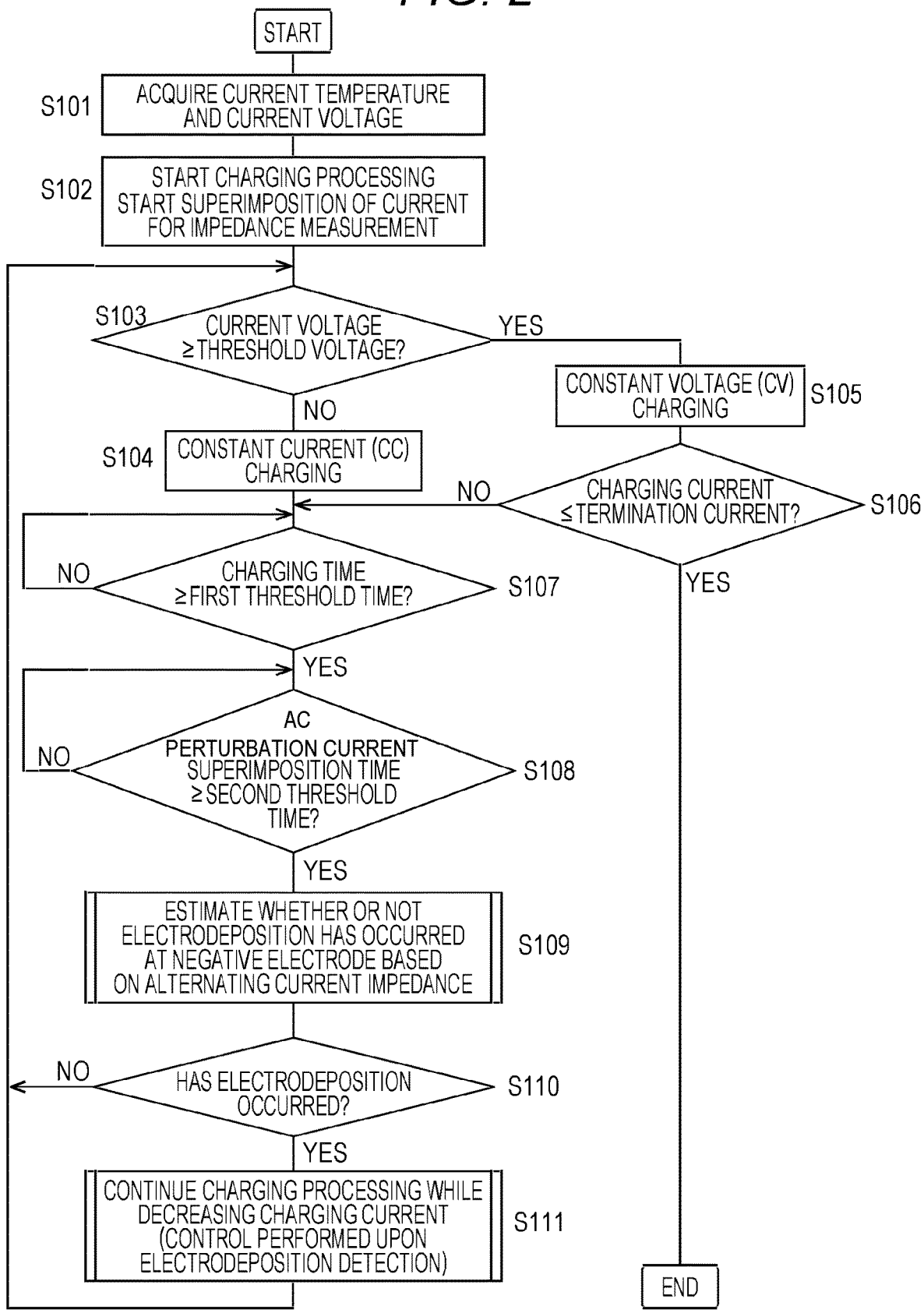
FIG. 2 is a flowchart illustrating a procedure of charging processing in the all-solid-state battery system 1.

In the charging processing in the present embodiment, when the charging processing is performed on the all-solid-state battery 2, the AC impedance (complex impedance) of the all-solid-state battery 2 is measured, and the state (here, the presence or absence of occurrence of electrodeposition in the solid electrolyte layer) of the all-solid-state battery 2 is estimated based on the measured AC impedance (complex impedance) of the all-solid-state battery 2. In the present embodiment, in a case where it is estimated that the electrodeposition has occurred, the conditions of the charging processing is changed so that the electrodeposition becomes less likely to proceed. Note that this charging processing is performed by the controller 8 unless otherwise specified. A procedure of this charging processing will be described below with reference to FIG. 2. FIG. 2 is a flowchart illustrating a procedure of the charging processing in the all-solid-state battery system 1.

First, the controller 8 acquires a current temperature from the temperature sensor 4 and acquires a current voltage from the voltage sensor 3 (S101).

Subsequently, the controller 8 starts control for performing the charging processing of the all-solid-state battery 2. Specifically, electric power is introduced from the external power supply 8 to the voltage current adjustment device 5, and charging processing is started (normally, constant current (CC) charging is started) (S102). At the same time, the controller 8 controls the impedance measuring device 7 to start superimposing an AC perturbation current as an input signal for measuring the AC impedance of the all-solid-state battery 2 (S102). In this step, it is preferable to prevent a superimposed current from flowing through a path that is not a measurement target by using the principle of an AC bridge as in an internal resistance measurement device like the one described in FIG. 2 of International Publication No. 2012/077450. With such a configuration, influence of a load or the like connected to the all-solid-state battery 2 on a measurement result of the AC impedance can be reduced, and the AC impedance can be measured with high accuracy.

As described above, the constant current constant voltage (CC-CV) charging method is used for the control of the charging processing in the present embodiment. Therefore, after starting the charging processing, the controller 8 determines whether or not the current voltage acquired from the voltage sensor 3 is equal to or higher than a predetermined voltage (threshold voltage) determined in advance as an index indicating a timing of switching from constant current (CC) charging to constant voltage (CV) charging (S103). In a case where the current voltage is not equal to nor higher than the threshold voltage (S103: NO), the controller 8 continues charging by the constant current (CC) charging method (S104). In this case, the controller 8 performs control (estimation of whether or not electrodeposition has occurred in the solid electrolyte layer of the all-solid-state battery 2) according to the present invention, which will be described later.

Meanwhile, in a case where the current voltage is equal to or higher than the threshold voltage in step S103 (S103: YES), the controller 8 performs charging by the constant voltage (CV) charging method (S105). In this case, the controller 8 determines whether or not the current electric current (charging current) acquired from the current sensor 6 is equal to or less than a predetermined current (termination current) determined in advance as an index indicating a timing of termination of constant voltage (CV) charging (S106). In a case where the current electric current (charging current) is equal to or less than the termination current (S106: YES), the controller 8 finishes this processing. Thereafter, the charging processing is also finished as necessary.

Meanwhile, in a case where the current electric current (charging current) is larger than the termination current in step S106 (S106: NO), the controller 8 also performs the control (estimation of whether or not electrodeposition has occurred in the solid electrolyte layer of the all-solid-state battery 2) according to the present invention, which will be described later.

In a case where the constant current charging of the all-solid-state battery 2 is performed (S104) or in a case where the constant voltage charging of the all-solid-state battery 2 is performed and the current electric current (charging current) is larger than the termination current (S106: NO), the controller 8 determines whether or not an elapsed time (charging time) from the start of charging acquired from a built-in timer (not illustrated) is equal to or longer than a predetermined time (first threshold time) (S107). In a case where the charging time is not equal to nor longer than the first threshold time (S107: NO), the controller 8 repeatedly performs this determination until the charging time becomes equal to or longer than the first threshold time. The current value is unstable in an initial stage of application of the charging current, and a transient change in the current value may influence the control according to the present invention (estimation of whether or not electrodeposition has occurred in the solid electrolyte layer). The reason why step S107 is performed is to improve accuracy of determination of whether or not electrodeposition has occurred in the solid electrolyte layer by eliminating this influence. A specific value of the first threshold time can be appropriately set, and is, for example, several tens to several hundreds of milliseconds.

Subsequently, in a case where the charging time is equal to or longer than the first threshold time in step S107 (S107: YES), the controller 8 determines whether or not an elapsed time (AC perturbation current superimposition time) from the start of superimposition of the AC perturbation current acquired from the built-in timer (not illustrated) is equal to or longer than a predetermined time (second threshold time) (S108). In a case where the AC perturbation current superimposition time is not equal to nor longer than the second threshold time (S108: NO), the controller 8 repeatedly performs this determination until the AC perturbation current superimposition time becomes equal to or longer than the second threshold time. Also regarding the AC perturbation current superimposed for measuring the AC impedance, the current value is unstable in initial stage of application, and a transient change in the current value may influence the control according to the present invention (estimation of whether or not electrodeposition has occurred). The reason why step S108 is performed is to improve accuracy of the determination of whether or not electrodeposition has occurred in the solid electrolyte layer by eliminating this influence. A specific value of the second threshold time can be appropriately set, and is, for example, several tens to several hundreds of milliseconds.

Subsequently, in a case where the AC perturbation current superimposing time is equal to or longer than the second threshold time in step S108 (S108: YES), the controller 8 estimates whether or not electrodeposition has occurred in the solid electrolyte layer of the all-solid-state battery 2 based on the AC impedance measured by the impedance measuring device (S109).

Figure 3:
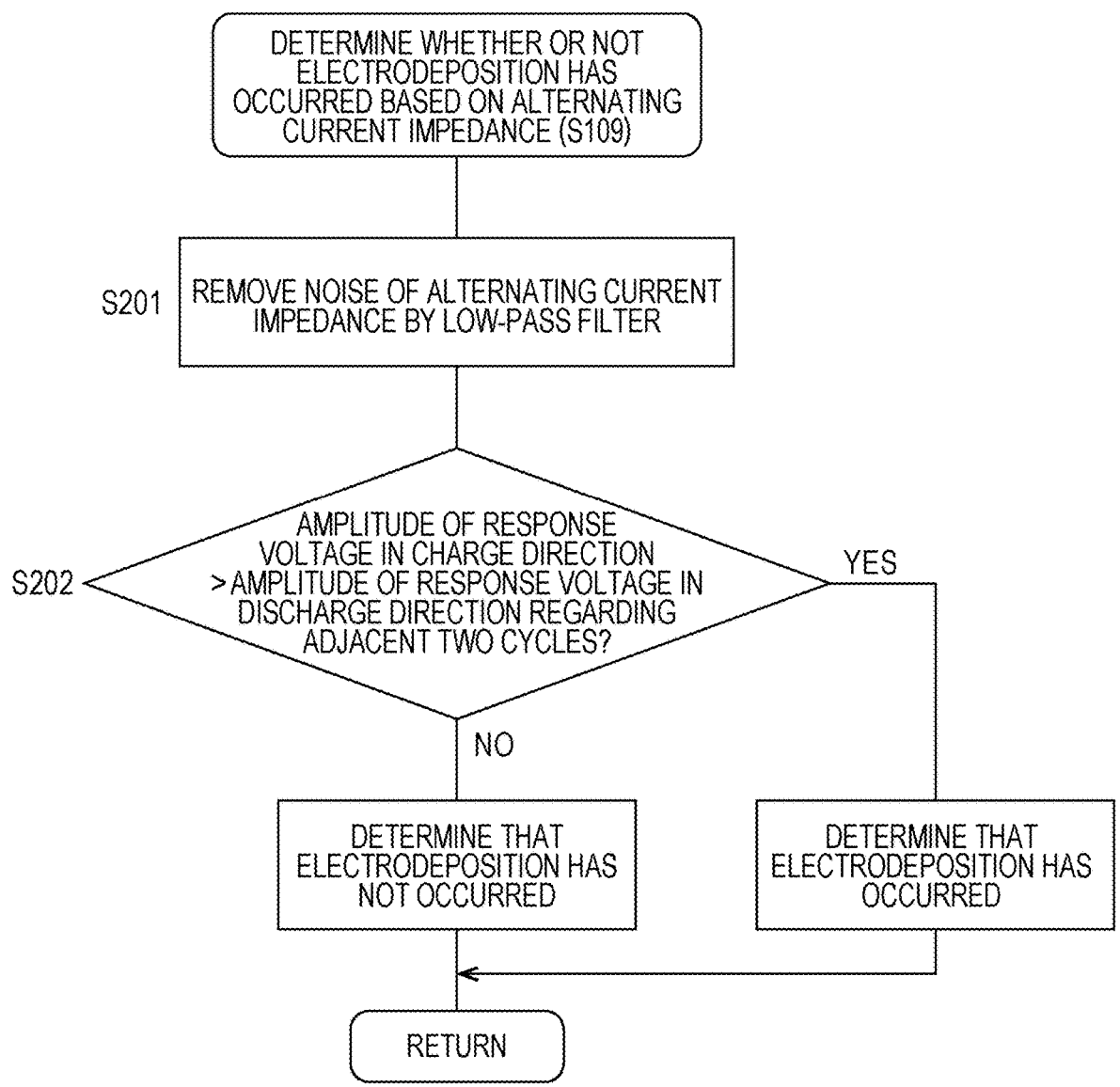
FIG. 3 is a subroutine flowchart of step S109 in FIG. 2.

FIG. 3 is a subroutine flowchart of step S109 in FIG. 2.

Figure 4:
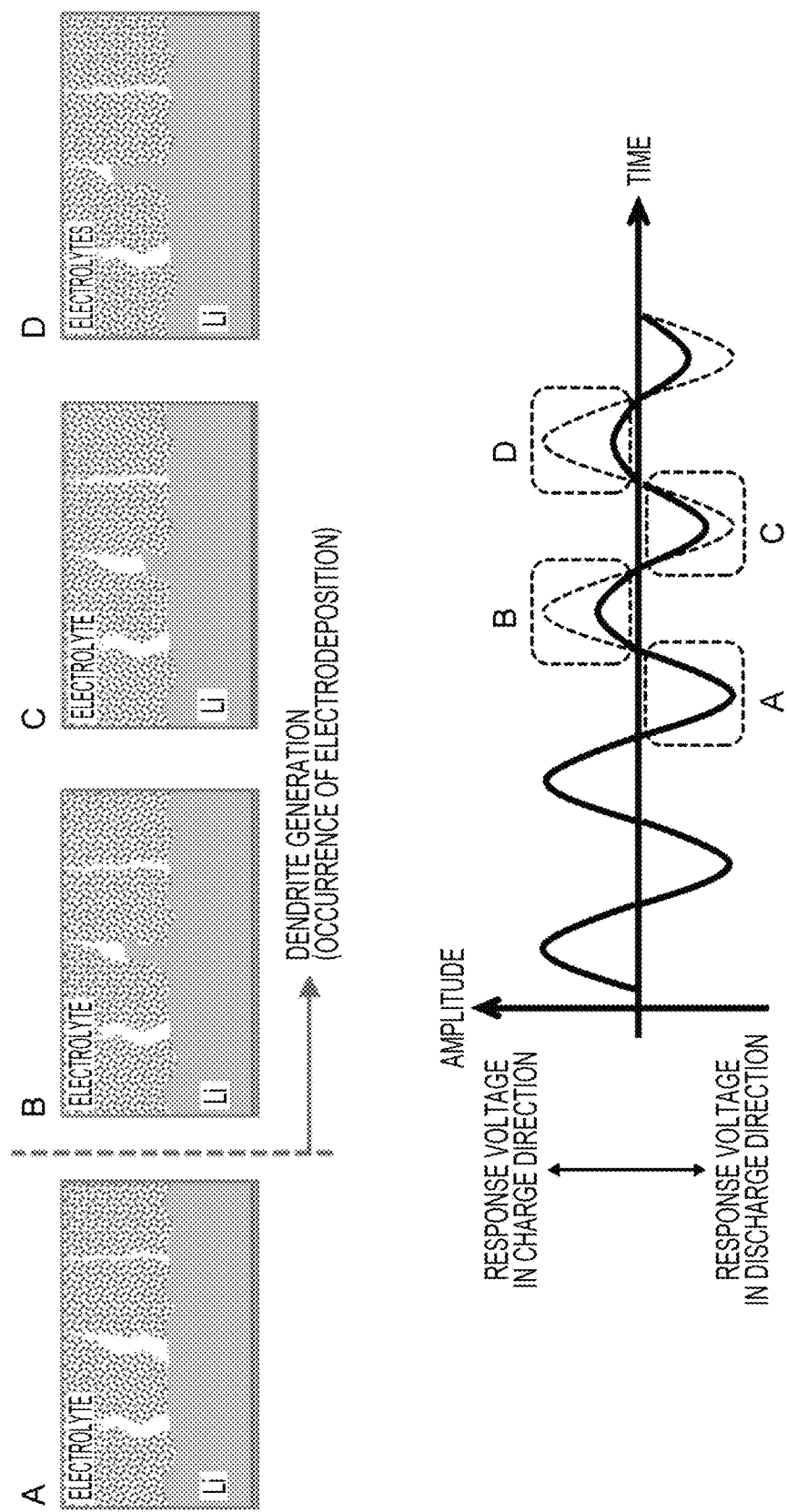
FIG. 4 is a graph illustrating a transition of a state of an interface between a negative electrode active material layer and a solid electrolyte layer before and after occurrence of electrodeposition of metal lithium in the negative electrode active material layer of the all-solid-state battery, and curves of a response voltage of an AC impedance corresponding to respective states.

In the subroutine illustrated in FIG. 3, the controller 8 first acquires, as an output signal of the impedance measuring device 7, a waveform of a response voltage (or positive and negative amplitude values calculated from the waveform) as illustrated in FIG. 4 as a measurement result of the AC impedance measured by the impedance measuring device 7. At this time, the controller 8 removes noise caused by a high-frequency component in the output from the impedance measuring device 7 by using a low-pass filter (LPF) and the like (S201).

Subsequently, the controller 8 determines whether or not the amplitude of the response voltage in the charge direction is a predetermined ratio or less with respect to the amplitude of the response voltage in the discharge direction in a previous cycle when comparing two adjacent cycles regarding the waveform of the response voltage (normally, a sine wave) as the output signal of the impedance measuring device 7 acquired in step S201 (S202). Here, as illustrated in FIG. 4, when electrodeposition of metal lithium occurs in the solid electrolyte layer of the all-solid-state battery 2, there occurs a phenomenon that the amplitude of the response voltage in the charge direction becomes smaller than the amplitude of the response voltage in the discharge direction regarding the response voltage of the AC impedance obtained by applying an alternating current having a specific frequency and a constant amplitude. This will be explained as follows with reference to FIG. 4.

FIG. 4 is a graph illustrating a transition of a state of an interface between the negative electrode active material layer and the solid electrolyte layer before and after occurrence of electrodeposition of metal lithium in the solid electrolyte layer of the all-solid-state battery 2, and curves of a response voltage of an AC impedance corresponding to respective states. In the response voltage curve illustrated in FIG. 4, the solid line graph indicates a response voltage assumed when electrodeposition occurs in the present embodiment, and the broken line graph is a virtual line indicating a response voltage obtained when electrodeposition does not occur. First, as a premise, in a case where an alternating current having a constant amplitude is applied (superimposed), a value (V) of the response voltage also decreases when an internal resistance value (R) of the battery decreases according to Ohm's law (V=I×R). On the other hand, when R increases, V also increases. In addition, occurrence of electrodeposition (dendrite) means that lithium ions easily permeate the inside of the solid electrolyte layer, and thus when electrodeposition occurs, the internal resistance value of the battery decreases as electrolyte resistance decreases, and as a result, the response voltage also decreases.

Here, a state in which an alternating current in the discharge direction is applied when electrodeposition (dendrite) of metal lithium does not occur in the solid electrolyte layer is the state A illustrated in FIG. 4. The application of the alternating current in the discharge direction acts to offset the charging current from the external power supply 9, and therefore acts to suppress occurrence of electrodeposition (dendrite). For this reason, it is usually unlikely that electrodeposition starts to occur when an alternating current is applied in the discharge direction as in the state A. Next, when the state A changes to the state B, an application direction of the alternating current is switched to the charge direction. Since the application of the alternating current in the charge direction acts to increase the charging current from the external power supply 9, and therefore acts to promote occurrence of electrodeposition (dendrite). For this reason, electrodeposition generally starts to occur when an alternating current is applied in the charge direction as in the state B. When electrodeposition (dendrite) occurs in the state B, the amplitude of the response voltage (in the charge direction) decreases due to a decrease in the internal resistance value of the battery as described above. In step S202 of the present embodiment, the controller 8 determines whether or not this phenomenon is occurring. Specifically, it is determined whether or not the amplitude of the response voltage in the charge direction (here, the amplitude of the state B) is a predetermined ratio or less with respect to the amplitude of the response voltage in the discharge direction (here, the amplitude of the state A) in the previous cycle when two adjacent cycles such as a cycle including the state A and a cycle including the state B are compared. Note that a specific value of the predetermined ratio is not limited in particular, and can be appropriately set in consideration of required accuracy of detection of electrodeposition (dendrite), for example. When the application of the alternating current is continued even after the state B, the occurrence of electrodeposition (dendrite) is suppressed and the amplitude recovers to be slightly larger than that in the state B in the state C in which the alternating current in the discharge direction is applied. Thereafter, in the state D in which the alternating current in the charge direction is applied, the occurrence of electrodeposition is further promoted, and the amplitude changes so as to become smaller than that in the state C (and that in the state B). When the application of the alternating current is continued without changing the charging conditions even after the occurrence of electrodeposition (dendrite), a similar profile is repeated. In the present embodiment, the controller 8 determines whether or not the amplitude of the response voltage in the charge direction is a predetermined ratio or less with respect to the amplitude of the response voltage in the discharge direction in the previous cycle when comparing two adjacent cycles, as described above. The controller 8 may compare the state A and the state B illustrated in FIG. 4, may compare the state B and the state C, or may compare the state C and the state D. Thus detecting occurrence of electrodeposition has an advantage that the occurrence of electrodeposition can be promptly known in real time and it is not necessary to set a threshold value such as a reaction resistance value in advance.

In a case where it is determined in step S202 that the amplitude of the response voltage in the charge direction is not a predetermined ratio or less with respect to the amplitude of the response voltage in the discharge direction in the previous cycle when two adjacent cycles are compared (S202: NO), it is estimated that electrodeposition has not occurred in the solid electrolyte layer of the all-solid-state battery 2 at that time. Meanwhile, in a case where it is determined in step S202 that the amplitude is the predetermined ratio or less (S202: YES), it is estimated that electrodeposition has occurred in the solid electrolyte layer of the all-solid-state battery 2 at that time.

See the flowchart illustrated in FIG. 2. In a case where it is estimated in step S202 that electrodeposition in the solid electrolyte layer has not occurred (S110: NO), the controller 8 restarts the processing from step S103. Meanwhile, in a case where it is determined in step S202 that electrodeposition has occurred in the solid electrolyte layer (S110: YES), the controller 8 performs control performed upon electrodeposition detection (S111). After performing the control performed upon electrodeposition detection, the controller 8 resumes the processing from step S103.

A specific form of the control performed upon electrodeposition detection is not limited in particular, but the control performed upon electrodeposition detection is preferably processing for changing the conditions of the charging processing so that the electrodeposition at the negative electrode becomes harder to proceed. For example, the controller 8 can perform control for stopping charging as the control performed upon electrodeposition detection. In this case, if necessary, the user may be notified that the charging has stopped. Alternatively, the controller 8 may perform, as the control performed upon electrodeposition detection, discharging processing for a predetermined time at a predetermined current value (C rate) smaller than the charging current during the charging after stopping the charging. In this case, if necessary, the user may be notified about this. In a case where such control performed upon electrodeposition detection is performed, the progress of the electrodeposition in the solid electrolyte layer in subsequent charge and discharging processing can be prevented by appropriately setting conditions (the current value (C rate) and the time) of the discharging processing in advance. Alternatively, as illustrated in FIG. 2, the controller 8 may perform, as the control performed upon electrodeposition detection, control for continuing the charging processing while decreasing the charging current (C rate). In this case, if necessary, the user may be notified about this or that a time required for charging up to a predetermined voltage will be extended. Also in a case where such control performed upon electrodeposition detection is performed, the progress of the electrodeposition in the solid electrolyte layer in subsequent charging processing can be prevented by appropriately setting the conditions (the current value (C rate) and the time) of the charging processing after the change of the conditions in advance. Further, for example, in a case where it is determined in step S202 that electrodeposition has occurred in the solid electrolyte layer, when a measured value of the battery temperature measured by the temperature sensor 4 is lower than a predetermined threshold temperature, the controller 8 may increase the battery temperature by heating the battery by using a heater (not illustrated) or the like. According to such control, there is an advantage that values of yield stress and Young's modulus of the negative electrode active material layer composed of metal lithium decrease, and the electrodeposition that has occurred becomes harder to progress into the solid electrolyte layer.

Although the control according to the present invention has been described in detail above, the embodiment described with reference to the drawings is merely an example, and appropriate modifications of the present invention may be made within the scope of the technical idea of the invention described in the claims.

For example, in the above embodiment, the controller 8 determines whether or not electrodeposition has occurred by determining whether or not the amplitude of the response voltage in the charge direction is a predetermined ratio or less with respect to the amplitude of the response voltage in the discharge direction in the previous cycle when comparing two adjacent cycles regarding the waveform of the response voltage (normally a sine wave) as the output signal of the impedance measuring device 7. Alternatively, for example, the controller 8 may determine whether or not electrodeposition has occurred by also performing similar comparison between different cycles that are not adjacent to each other and determining whether or not an amplitude of a response voltage in the charge direction is a predetermined ratio or less with respect to an amplitude of a response voltage in the discharge direction in a preceding or later cycle in a similar manner to that described above.

Further, according to still another embodiment of the present invention, there is also provided a charging device for an all-solid-state lithium ion secondary battery for charging an all-solid-state lithium ion secondary battery including a negative electrode active material layer containing a negative electrode active material containing metal lithium. Specifically, the charging device for an all-solid-state lithium ion secondary battery includes a charger for charging the all-solid-state lithium ion secondary battery, an AC impedance measuring device for measuring an AC impedance of the all-solid-state lithium ion secondary battery, and a controller that determines whether or not electrodeposition of metal lithium has occurred in the solid electrolyte layer. The controller determines whether or not electrodeposition of metal lithium has occurred in the solid electrolyte layer based on a relationship between an amplitude of a response signal in a discharge direction and an amplitude of a response signal in a charge direction of an AC impedance measured by the AC impedance measuring device when the charger charges the all-solid-state lithium ion secondary battery.

Further, according to still another aspect of the present invention, there is also provided a method for charging an all-solid-state lithium ion secondary battery for charging an all-solid-state lithium ion secondary battery. According to the method for charging an all-solid-state lithium ion secondary battery, when a charger charges the all-solid-state lithium ion secondary battery, it is determined whether or not electrodeposition of metal lithium has occurred in a solid electrolyte layer of the battery on the basis of a relationship between an amplitude of a response signal in a discharge direction and an amplitude of a response signal in a charge direction of an AC impedance of the all-solid-state lithium ion secondary battery.

An all-solid-state lithium ion secondary battery constituting the all-solid-state lithium ion secondary battery system according to the present embodiment will be described below.

Figure 5:
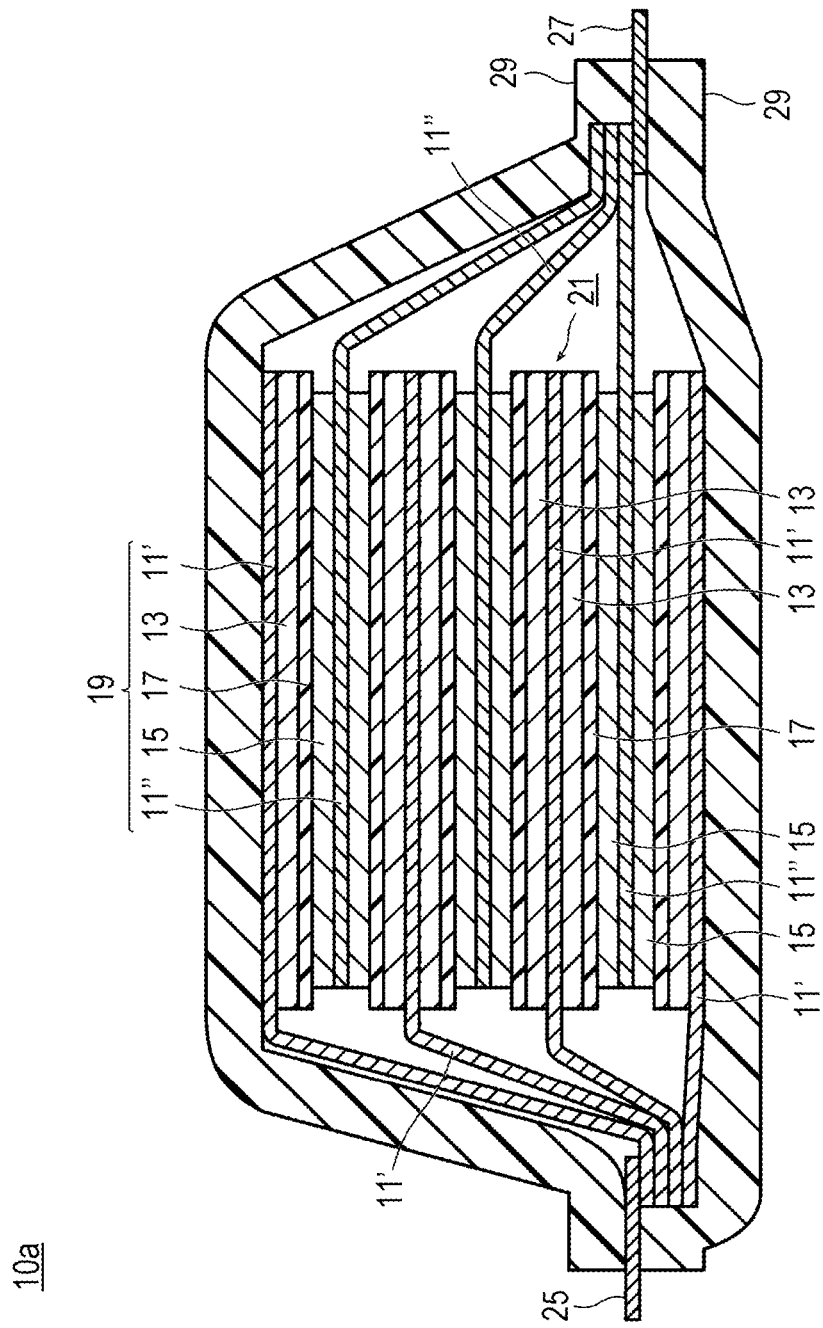
FIG. 5 is a cross-sectional view schematically illustrating an overall structure of a laminate type (internal parallel connection type) all-solid-state lithium ion secondary battery (laminate type secondary battery) according to an embodiment of the present invention.

FIG. 5 is a cross-sectional view schematically illustrating an overall structure of a laminate type (internal parallel connection type) all-solid-state lithium ion secondary battery (hereinafter also simply referred to as a "laminate type secondary battery") according to an embodiment of the present invention. A laminate type secondary battery 10a illustrated in FIG. 5 has a structure in which a substantially rectangular power generating element 21 in which a charge discharge reaction actually proceeds is sealed inside a laminate film 29 which is a battery outer casing body.

As illustrated in FIG. 5, the power generating element 21 of the laminate type secondary battery 10a of the present embodiment has a configuration in which a positive electrode in which a positive electrode active material layer 13 is disposed on both surfaces of a positive electrode current collector 11', a solid electrolyte layer 17, and a negative electrode in which a negative electrode active material layer 15 is disposed on both surfaces of a negative electrode current collector 11" are laminated. Specifically, the positive electrode, the solid electrolyte layer, and the negative electrode are laminated in this order so that one positive electrode active material layer 13 and the negative electrode active material layer 15 adjacent thereto face each other with the solid electrolyte layer 17 interposed therebetween. In this way, the positive electrode, solid electrolyte layer, and negative electrode that are adjacent constitute one single battery layer 19. Therefore, it can be said that the laminate type secondary battery 10a illustrated in FIG. 5 has a configuration in which a plurality of single battery layers 19 are laminated to be electrically connected in parallel. Although the positive electrode active material layer 13 is disposed on only one surface of each of outermost positive electrode current collectors located in both outermost layers of the power generating element 21, the active material layer may be provided on both surfaces. That is, instead of using a current collector exclusively for an outermost layer provided with the active material layer only on one surface thereof, a current collector provided with the active material layer on both surfaces thereof may be used as it is as an outermost current collector. Furthermore, the positions of the positive electrode and the negative electrode may be made reverse to those in FIG. 5, so that an outermost negative electrode current collector is disposed in both outermost layers of the power generating element 21 and the negative electrode active material layer is disposed on one side or both sides of the outermost negative electrode current collector.

A positive electrode current collecting plate 25 and a negative electrode current collecting plate 27 which are electrically conductive with the respective electrodes (the positive electrode and the negative electrode) are respectively attached to the positive electrode current collector 11' and the negative electrode current collector 11" and are led to an outside of the laminate film 29 so as to be sandwiched between end portions of the laminate film 29. The positive electrode current collecting plate 25 and the negative electrode current collecting plate 27 may be attached to the positive electrode current collector 11' and the negative electrode current collector 11" of the respective electrodes with a positive electrode terminal lead and a negative electrode terminal lead (not illustrated) interposed therebetween, respectively by ultrasonic welding, resistance welding, or the like as necessary.

In the above description, one embodiment of the all-solid-state battery according to one embodiment of the present invention has been described by taking a laminate type (internal parallel connection type) all-solid-state lithium ion secondary battery as an example. However, the type of the all-solid-state battery to which the present invention can be applied is not limited in particular, and the present invention can also be applied to a bipolar type (bipolar type) all-solid-state battery including a bipolar type electrode having a positive electrode active material layer electrically coupled to one surface of a current collector and a negative electrode active material layer electrically coupled to an opposite surface of the current collector.

Figure 6:
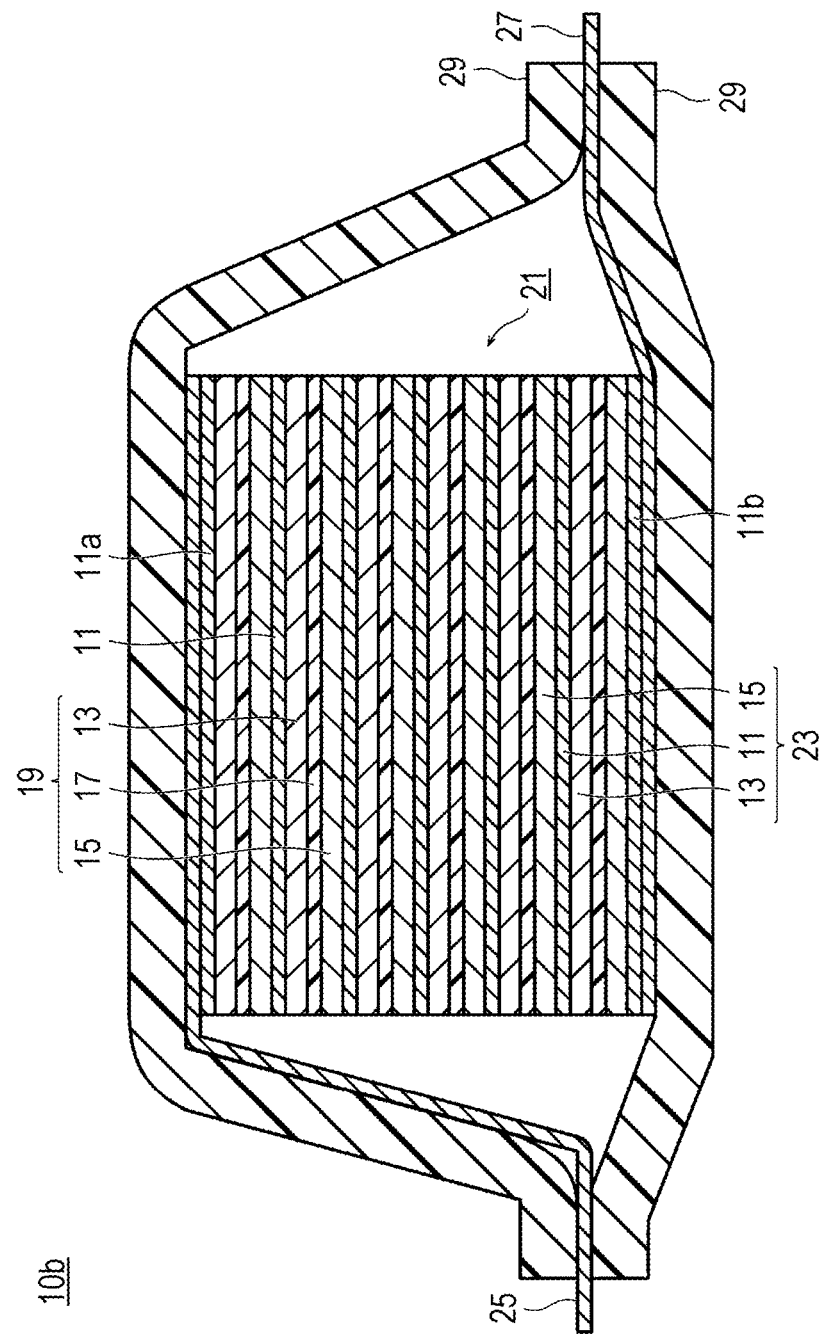
FIG. 6 is a cross-sectional view schematically illustrating a bipolar type (bipolar type) all-solid-state lithium ion secondary battery (bipolar type secondary battery) according to an embodiment of the present invention.

FIG. 6 is a cross-sectional view schematically illustrating a bipolar type (bipolar type) all-solid-state lithium ion secondary battery (hereinafter also simply referred to as a "bipolar type secondary battery") according to an embodiment of the present invention. A bipolar type secondary battery 10b illustrated in FIG. 6 has a structure in which a substantially rectangular power generating element 21 in which a charge discharge reaction actually proceeds is sealed inside a laminate film 29 which is a battery outer casing body.

As illustrated in FIG. 6, the power generating element 21 of the bipolar type secondary battery 10b of the present embodiment has a plurality of bipolar type electrodes 23 in which a positive electrode active material layer 13 electrically coupled to one surface of a current collector 11 is provided and a negative electrode active material layer 15 electrically coupled to an opposite surface of the current collector 11 is provided. The bipolar type electrodes 23 are laminated with a solid electrolyte layer 17 interposed therebetween to form the power generating element 21. The solid electrolyte layer 17 has a configuration in which a solid electrolyte is formed in layers. The bipolar type electrode 23 and the solid electrolyte layer 17 are alternately laminated such that the positive electrode active material layer 13 of one bipolar type electrode 23 and the negative electrode active material layer 15 of another bipolar type electrode 23 adjacent to the one bipolar type electrode 23 face each other with the solid electrolyte layer 17 interposed therebetween. That is, the solid electrolyte layer 17 is interposed between the positive electrode active material layer 13 of one bipolar type electrode 23 and the negative electrode active material layer 15 of another bipolar type electrode 23 adjacent to the one bipolar type electrode 23.

The positive electrode active material layer 13, the solid electrolyte layer 17, and the negative electrode active material layer 15 that are adjacent to each other constitute one single battery layer 19. Therefore, it can also be said that the bipolar type secondary battery 10b has a configuration in which the single battery layers 19 are laminated. The positive electrode active material layer 13 is provided only on one surface of an outermost current collector 11a on the positive electrode side located in an outermost layer of the power generating element 21. Further, the negative electrode active material layer 15 is provided only on one surface of an outermost current collector 11b on the negative electrode side located in an outermost layer of the power generating element 21.

Further, in the bipolar type secondary battery 10b illustrated in FIG. 6, a positive electrode current collecting plate (positive electrode tab) 25 is disposed so as to be adjacent to the outermost current collector 11a on the positive electrode side and is extended to be led out from the laminate film 29 which is a battery outer casing body. Meanwhile, a negative electrode current collecting plate (negative electrode tab) 27 is disposed so as to be adjacent to the outermost current collector 11b on the negative electrode side and similarly is extended to be led out from the laminate film 29.

The number of times of lamination of the single battery layers 19 is adjusted according to a desired voltage. In the bipolar type secondary battery 10b, the number of times of lamination of the single battery layers 19 may be reduced as long as sufficient output can be secured even if the thickness of the battery is reduced as much as possible. Also in the bipolar type secondary battery 10b, it is preferable to employ a structure in which the power generating element 21 is sealed in the laminate film 29, which is a battery outer casing body, under reduced pressure, and the positive electrode current collecting plate 25 and the negative electrode current collecting plate 27 are taken out to the outside of the laminate film 29 in order to prevent external impact and environmental deterioration during use.

Main components of the laminate type secondary battery 10a described above will be described below.

[Current Collector]

A current collector has a function of mediating transfer of electrons from one surface in contact with a positive electrode active material layer to the other surface in contact with a negative electrode active material layer. A material of which the current collector is made is not limited in particular. As the material of which the current collector is made, for example, a metal or a resin having electric conductivity can be adopted.

Specific examples of the metal include aluminum, nickel, iron, stainless steel, titanium, copper, and the like. In addition to these, a clad material of nickel and aluminum, a clad material of copper and aluminum, or the like may be used. Further, a foil in which a metal surface is coated with aluminum may be used. Above all, aluminum, stainless steel, copper, and nickel are preferable from the viewpoint of electron conductivity, a battery operating potential, adhesion of a negative electrode active material by sputtering to the current collector, and the like.

Examples of the latter resin having electric conductivity include a resin obtained by adding an electrically conductive filler to a non-electrically-conductive polymer material as necessary.

Examples of the non-electrically-conductive polymer material include polyethylene (PE; high density polyethylene (HDPE), low density polyethylene (LDPE), and the like), polypropylene (PP), polyethylene terephthalate (PET), polyether nitrile (PEN), polyimide (PI), polyamide imide (PAI), polyamide (PA), polytetrafluoroethylene (PTFE), styrene-butadiene rubber (SBR), polyacrylonitrile (PAN), polymethyl acrylate (PMA), polymethyl methacrylate (PMMA), polyvinyl chloride (PVC), polyvinylidene fluoride (PVdF), polystyrene (PS), and the like. Such a non-electrically-conductive polymer material can have excellent potential resistance or solvent resistance.

An electrically conductive filler may be added to the electrically conductive polymer material or the non-electrically-conductive polymer material as necessary. In particular, in a case where a resin serving as a base material of the current collector is composed only of a non-electrically-conductive polymer, an electrically conductive filler is essential to impart electric conductivity to the resin.

The electrically conductive filler can be used without particular limitation as long as the electrically conductive filler is a substance having electric conductivity. Examples of a material excellent in electric conductivity, potential resistance, or lithium ion blocking property include metals and electrically conductive carbon. Examples of the metals are not limited in particular but preferably includes at least one kind of metal selected from the group consisting of Ni, Ti, Al, Cu, Pt, Fe, Cr, Sn, Zn, In, and Sb, or an alloy or a metal oxide containing these metals. The electrically conductive carbon is not limited in particular. Preferably, examples of the electrically conductive carbon include at least one kind selected from the group consisting of acetylene black, Vulcan (registered trademark), Black Pearl (registered trademark), carbon nanofiber, Ketjen black (registered trademark), carbon nanotube, carbon nanohorn, carbon nanoballoon, and fullerene.

An added amount of the electrically conductive filler is not limited in particular as long as sufficient electric conductivity can be imparted to the current collector, and is generally 5 mass % to 80 mass % with respect to 100 mass % of the total mass of the current collector.

The current collector may have a single-layer structure made of a single material or may have a laminated structure in which layers made of these materials are appropriately combined. From the viewpoint of weight reduction of the current collector, it is preferable that the current collector includes at least an electrically conductive resin layer made of a resin having electric conductivity. From the viewpoint of blocking movement of lithium ions between single battery layers, a metal layer may be provided in a part of the current collector.

[Negative Electrode Active Material Layer]

A negative electrode active material layer contains a negative electrode active material. The negative electrode active material preferably includes a metal lithium simple substance (Li) or a lithium-containing alloy. The kind of these negative electrode active materials is not limited in particular, but examples of the Li-containing alloy include an alloy of Li and at least one of In, Al, Si, and Sn. In some cases, two or more kinds of negative electrode active materials may be used in combination. Needless to say, a negative electrode active material other than the ones described above may be used.

Examples of a shape of the negative electrode active material include a particulate shape (a spherical shape, a fibrous shape) and a thin film shape. In a case where the negative electrode active material has a particle shape, an average particle diameter ($D_{50}$) thereof is, for example, preferably within a range of 1 nm to 100 μm, more preferably within a range of 10 nm to 50 μm, still more preferably within a range of 100 nm to 20 μm, and particularly preferably within a range of 1 to 20 km. In the present specification, the value of the average particle diameter ($D_{50}$) of the active material can be measured by a laser diffraction scattering method.

The content of the negative electrode active material in the negative electrode active material layer is not limited in particular, but for example, is preferably within a range of 40 mass % to 99 mass %, and more preferably within a range of 50 mass % to 90 mass %.

The negative electrode active material layer preferably further contains a solid electrolyte. In a case where the negative electrode active material layer contains a solid electrolyte, ion conductivity of the negative electrode active material layer can be improved. Examples of the solid electrolyte include a sulfide solid electrolyte and an oxide solid electrolyte, but the negative electrode active material layer preferably contains a sulfide solid electrolyte from the viewpoint of being hardly affected by crystal grain boundaries in general and therefore having a large substantial fracture toughness value (that is, cracks caused by dendrite are less likely to develop) and having high ion conductivity.

Examples of the sulfide solid electrolyte include LiI—$Li_2S$—$SiS_2$, LiI—$Li_2S$—$P_2O_5$, LiI—$Li_3PO_4$—$P_2S_5$, $Li_2S$—$P_2S_5$, LiI—$Li_3PS_4$, LiI—LiBr—$Li_3PS_4$, $Li_3PS_4$, $Li_2S$—$P_2S_5$, $Li_2S$—$P_2S_5$—LiI, $Li_2S$—$P_2S_5$—$Li_2O$, $Li_2S$—$P_2S_5$—$Li_2O$—LiI, $Li_2S$—$SiS_2$, $Li_2S$—$SiS_2$—LiI, $Li_2S$—$SiS_2$—LiBr, $Li_2S$—$SiS_2$—LiCl, $Li_2S$—$SiS_2$—$B_2S_3$—LiI, $Li_2S$—$SiS_2$—$P_2S_5$—LiI, $Li_2S$—$B_2S_3$, $Li_2S$—$P_2S_5$—$Z_mS_n$ (where m and n are positive numbers, and Z is any of Ge, Zn, and Ga), $Li_2S$—$GeS_2$, $Li_2S$—$SiS_2$—$Li_3PO_4$, and $Li_2S$—$SiS_2$—$Li_xMO_y$ (where x and y are positive numbers, and M is any of P, Si, Ge, B, Al, Ga, and In). The description "$Li_2S$—$P_2S_5$" means a sulfide solid electrolyte using a raw material composition containing $Li_2S$ and $P_2S_5$, and the same applies to other descriptions.

The sulfide solid electrolyte, for example, may have a $Li_3PS_4$ skeleton, may have a $Li_4P_2S_7$ skeleton, or may have a $Li_4P_2S_6$ skeleton. Examples of the sulfide solid electrolyte having a $Li_3PS_4$ skeleton include LiI—$Li_3PS_4$, LiI—LiBr—$Li_3PS_4$, and $Li_3PS_4$. Examples of the sulfide solid electrolyte having a $Li_4P_2S_7$ skeleton include a Li—P—S-based solid electrolyte called LPS (for example, $Li_7P_3S_{11}$). As the sulfide solid electrolyte, for example, LGPS expressed by $Li_{(4-x)}Ge_{(1-x)}P_xS_4$ (x satisfies 0<x<1) or the like may be used.

Above all, the sulfide solid electrolyte is preferably a sulfide solid electrolyte containing a P element, and the sulfide solid electrolyte is more preferably a material containing $Li_2S$—$P_2S_5$ as a main component. Furthermore, the sulfide solid electrolyte may contain halogen (F, Cl, Br, I).

In a case where the sulfide solid electrolyte is $Li_2S$—$P_2S_5$ based, a molar ratio of $Li_2S$ and $P_2S_5$ is preferably within a range of $Li_2S:P_2S_5$=50:50 to 100:0, and particularly preferably $Li_2S:P_2S_5$=70:30 to 80:20.

The sulfide solid electrolyte may be sulfide glass, may be crystallized sulfide glass, or may be a crystalline material obtained by a solid phase method. Note that the sulfide glass can be obtained, for example, by performing mechanical milling (ball milling or the like) on a raw material composition. The crystallized sulfide glass can be obtained, for example, by heat-treating sulfide glass at a temperature equal to or higher than a crystallization temperature. Ion conductivity (for example, Li ion conductivity) of the sulfide solid electrolyte at a normal temperature (25° C.) is, for example, preferably $1 \times 10^{-5}$ S/cm or more, and more preferably $1 \times 10^{-4}$ S/cm or more. Note that a value of the ion conductivity of the solid electrolyte can be measured by an AC impedance method.

Examples of the oxide solid electrolyte include a compound having a NASICON-type structure. Examples of the compound having a NASICON-type structure include a compound (LAGP) expressed by a general formula $Li_{1+x}Al_xGe_{2-x}(PO_4)_3$ ($0 \leq x \leq 2$) and a compound (LATP) expressed by a general formula $Li_{1+x}Al_xTi_{2-x}(PO_4)_3$ ($0 \leq x \leq 2$). Other examples of the oxide solid electrolyte include LiLaTiO (for example, $Li_{0.34}La_{0.51}TiO_3$), LiPON (for example, $Li_{2.9}PO_{3.3}N_{0.46}$), and LiLaZrO (for example, $Li_7La_3Zr_2O_{12}$).

Examples of a shape of the solid electrolyte include a particle shape such as a true spherical shape and an elliptical spherical shape, a thin film shape, and the like. In a case where the solid electrolyte has a particle shape, an average particle diameter ($D_{50}$) is not limited in particular, but is preferably 40 μm or less, more preferably 20 μm or less, and still more preferably 10 μm or less. On the other hand, the average particle diameter ($D_{50}$) is preferably 0.01 μm or more, and more preferably 0.1 μm or more.

The content of the solid electrolyte in the negative electrode active material layer is, for example, preferably within a range of 1 mass % to 60 mass %, and more preferably within a range of 10 mass % to 50 mass %.

The negative electrode active material layer may further contain at least one of a conductive aid and a binder in addition to the negative electrode active material and the solid electrolyte described above.

Examples of the conductive aid include, but are not limited to, metals such as aluminum, stainless steel (SUS), silver, gold, copper, and titanium, alloys or metal oxides containing these metals; and carbon such as carbon fibers (specifically, vapor grown carbon fibers (VGCF), polyacrylonitrile-based carbon fibers, pitch-based carbon fibers, rayon-based carbon fibers, and activated carbon fibers), carbon nanotubes (CNT), and carbon black (specifically, acetylene black, Ketjen black (registered trademark), furnace black, channel black, thermal lamp black, and the like). In addition, a particle-shaped ceramic material or resin material coated with the metal material by plating or the like can also be used as the conductive aid. Among these conductive aids, the conductive aid preferably contains at least one selected from the group consisting of aluminum, stainless steel, silver, gold, copper, titanium, and carbon, more preferably contains at least one selected from the group consisting of aluminum, stainless steel, silver, gold, and carbon, and still more preferably contains at least one kind of carbon from the viewpoint of electrical stability. These conductive aids may be used alone or may be used in combination of two or more kinds thereof.

A shape of the conductive aid is preferably a particle shape or a fibrous shape. In a case where the conductive aid has a particle shape, the shape of the particles is not limited in particular, and may be any shape such as a powder shape, a spherical shape, a rod shape, a needle shape, a plate shape, a columnar shape, an irregular shape, a scaly shape, or a spindle shape.

In a case where the conductive aid has a particle shape, an average particle diameter (primary particle diameter) is not limited in particular, but is preferably 0.01 μm to 10 μm from the viewpoint of electrical characteristics of the battery. In the present specification, the "particle diameter of the conductive aid" means a maximum distance L among distances between any two points on a contour line of the conductive aid. As a value of the "average particle diameter of the conductive aid", a value calculated as an average value of particle diameters of particles observed in several to several tens of fields of view by using an observation means such as a scanning electron microscope (SEM) or a transmission electron microscope (TEM) is adopted.

In a case where the negative electrode active material layer contains a conductive aid, the content of the conductive aid in the negative electrode active material layer is not limited in particular, but is preferably 0 mass % to 10 mass %, more preferably 2 mass % to 8 mass %, and still more preferably 4 mass % to 7 mass % with respect to the total mass of the negative electrode active material layer. Within such ranges, a stronger electron conduction path can be formed in the negative electrode active material layer, and it is possible to effectively contribute to improvement of battery characteristics.

On the other hand, the binder is not limited in particular, and examples thereof include the following materials.

Examples of the binder include thermoplastic polymers such as polybutylene terephthalate, polyethylene terephthalate, polyvinylidene fluoride (PVDF) (including a compound in which a hydrogen atom is substituted with another halogen element), polyethylene, polypropylene, polymethylpentene, polybutene, polyether nitrile, polytetrafluoroethylene, polyacrylonitrile, polyimide, polyamide, an ethylenevinyl acetate copolymer, polyvinyl chloride, styrene-butadiene rubber (SBR), an ethylene-propylene-diene copolymer, a styrene-butadiene-styrene block copolymer and hydrogenated products thereof, a styrene-isoprene-styrene block copolymer and hydrogenated products thereof, fluorine resins such as a tetrafluoroethylene-hexafluoropropylene copolymer (FEP), a tetrafluoroethylene-perfluoroalkylvinylether copolymer (PFA), an ethylene-tetrafluoroethylene copolymer (ETFE), polychlorotrifluoroethylene (PCTFE), an ethylene-chlorotrifluoroethylene copolymer (ECTFE), and polyvinyl fluoride (PVF), and vinylidene fluoride fluorine rubber such as vinylidene fluoride-hexafluoropropylene fluorine rubber (VDF-HFP fluorine rubber), vinylidene fluoride-hexafluoropropylene-tetrafluoroethylene fluorine rubber (VDF-HFP-TFE fluorine rubber), vinylidene fluoride-pentafluoropropylene fluorine rubber (VDF-PFP fluorine rubber), vinylidene fluoride-pentafluoropropylene-tetrafluoroethylene fluorine rubber (VDF-PFP-TFE fluorine rubber), vinylidene fluoride-perfluoromethyl vinyl ether-tetrafluoroethylene fluorine rubber (VDF-PFMVE-TFE fluorine rubber), vinylidene fluoride-chlorotrifluoroethylene fluorine rubber (VDF-CTFE fluorine rubber), and epoxy resins. Above all, polyimide, styrene-butadiene rubber, carboxymethyl cellulose, polypropylene, polytetrafluoroethylene, polyacrylonitrile, and polyamide are more preferable.

A thickness of the negative electrode active material layer varies depending on the configuration of the intended all-solid-state battery, but is preferably, for example, within a range of 0.1 μm to 1000 μm.

[Positive Electrode Active Material Layer]

A positive electrode active material layer contains a positive electrode active material. The kind of the positive electrode active material is not limited in particular, but a sulfur simple substance ($S_8$) or a reduction product (any of compounds $Li_2S_8$ to $Li_2S$) of sulfur containing lithium is preferably used. Here, for example, the sulfur simple substance ($S_8$) has an extremely large theoretical capacity of about 1670 mAh/g, and has an advantage of low cost and abundant resources. In this case, in a case where the all-solid-state lithium ion secondary battery is provided in a charged state, a sulfur simple substance ($S_8$) is contained as the positive electrode active material. In a case where the all-solid-state lithium ion secondary battery is provided in a discharged state, a reduction product (any of the compounds $Li_2S_8$ to $Li_2S$ described above) of sulfur containing lithium is contained as the positive electrode active material.

The positive electrode active material layer may contain a positive electrode active material other than the sulfur simple substance ($S_8$) or a reduction product (any of the compounds $Li_2S_8$ to $Li_2S$ described above) of sulfur containing lithium described above. However, a ratio of the sulfur simple substance or the reduction product of sulfur containing lithium in the positive electrode active material contained in the positive electrode active material layer is preferably 50 mass % to 100 mass %, more preferably 80 mass % to 100 mass %, still more preferably 90 mass % to 100 mass %, further still more preferably 95 mass % to 100 mass %, particularly preferably 98 mass % to 100 mass %, and most preferably 100 mass %.

[Examples of the positive electrode active material other than the sulfur simple substance or the reduction product of sulfur containing lithium include disulfide compounds, sulfur-modified polyacrylonitrile represented by the compounds described in International Publication No. 2010/044437, sulfur-modified polyisoprene, rubeanic acid (dithiooxamide), polysulfide carbon, and the like. Inorganic sulfur compounds such as S-carbon composite, $TiS_2$, $TiS_3$, $TiS_4$, NiS, $NiS_2$, CuS, $FeS_2$, $MoS_2$, $MoS_3$, and the like may also be used. Furthermore, examples of a positive electrode active material that does not contain sulfur include layered rock salt type active materials such as $LiCoO_2$, $LiMnO_2$, $LiNiO_2$, $LiVO_2$, and $Li(Ni-Mn-Co)O_2$, spinel type active materials such as $LiMn_2O_4$ and $LiNi_{0.5}Mn_{1.5}O_4$, olivine type active materials such as $LiFePO_4$ and $LiMnPO_4$, and Si-containing active materials such as $Li_2FeSiO_4$ and $Li_2MnSiO_4$. Examples of the oxide active material other than those described above include $Li_4Ti_5O_{12}$. In some cases, two or more kinds of positive electrode active materials may be used in combination. Needless to say, a positive electrode active material other than the ones described above may be used.

Examples of a shape of the positive electrode active material include a particle shape (a spherical shape, a fibrous shape) and a thin film shape. In a case where the positive electrode active material has a particle shape, an average particle diameter ($D_{50}$) thereof is, for example, preferably within a range of 1 nm to 100 μm, more preferably within a range of 10 nm to 50 μm, still more preferably within a range of 100 nm to 20 μm, and particularly preferably within a range of 1 μm to 20 μm. In the present specification, the value of the average particle diameter ($D_{50}$) of the active material can be measured by a laser diffraction scattering method.

The content of the positive electrode active material in the positive electrode active material layer is not limited in particular, but is, for example, preferably within a range of 40 mass % to 99 mass %, and more preferably within a range of 50 mass % to 90 mass %. As with the negative electrode active material layer described above, the positive electrode active material layer may further contain at least one of a solid electrolyte, a conductive aid, and a binder as necessary. Since specific forms of these materials are similar to those described above, detailed description thereof is omitted here.

[Solid Electrolyte Layer]

A solid electrolyte layer of a bipolar type secondary battery according to the present embodiment is a layer that contains a solid electrolyte as a main component and is interposed between the positive electrode active material layer and negative electrode active material layer described above. Since a specific form of the solid electrolyte contained in the solid electrolyte layer is similar to that described above, detailed description thereof is omitted here.

The content of the solid electrolyte in the solid electrolyte layer is, for example, preferably within a range of 10 mass % to 100 mass %, more preferably within a range of 50 mass % to 100 mass %, and still more preferably within a range of 90 mass % to 100 mass %.

The solid electrolyte layer may further contain a binder in addition to the solid electrolyte described above. Since a specific form of the binder that can be contained in the solid electrolyte layer is similar to as that described above, detailed description thereof is omitted here.

A thickness of the solid electrolyte layer varies depending on the configuration of the intended bipolar type secondary battery, but is, for example, preferably within a range of 0.1 μm to 1000 μm, more preferably within a range of 0.1 μm to 300 μm.

[Positive Electrode Current Collecting Plate and Negative Electrode Current Collecting Plate]

A material of which the current collecting plate (25, 27) is made is not limited in particular, and can be a known highly electrically conductive material conventionally used as a current collecting plate for a secondary battery. As the material of which the current collecting plate is made, for example, a metal material such as aluminum, copper, titanium, nickel, stainless steel (SUS), or an alloy thereof is preferable. From the viewpoint of lightweight, corrosion resistance, and high electric conductivity, aluminum and copper are more preferable, and aluminum is particularly preferable. The same material or different materials may be used for the positive electrode current collecting plate 27 and the negative electrode current collecting plate 25.

[Positive Electrode Lead and Negative Electrode Lead]

Although not illustrated, the current collector 11 and the current collecting plate (25, 27) may be electrically connected with a positive electrode lead or a negative electrode lead interposed therebetween. As a material of which the positive electrode and the negative electrode lead are made, a material used in a known lithium ion secondary battery can be similarly adopted. A portion taken out from an outer casing is preferably covered with a heat resistant and insulating heat shrinkable tube or the like so as not to affect a product (for example, an automotive component, in particular an electronic device and the like) due to electric leakage caused by contact with peripheral equipment, wiring, or the like.

[Battery Outer Casing Body]

As a battery outer casing body, a known metal can case can be used, and a bag-shaped case using the laminate film 29 containing aluminum that can cover a power generating element as illustrated in FIGS. 5 and 6 can be used. As the laminate film, for example, a laminate film or the like having a three-layer structure constituted by PP, aluminum, and nylon laminated in this order can be used, but the laminate film is not limited thereto. A laminate film is desirable from the viewpoint of high output and excellent cooling performance, and suitable application to batteries for large equipment for EV and HEV. Furthermore, the outer casing body is more preferably a laminate film containing aluminum from the perspective of easy adjustment of a group pressure applied to the power generating element from an outside.

Figure 7:
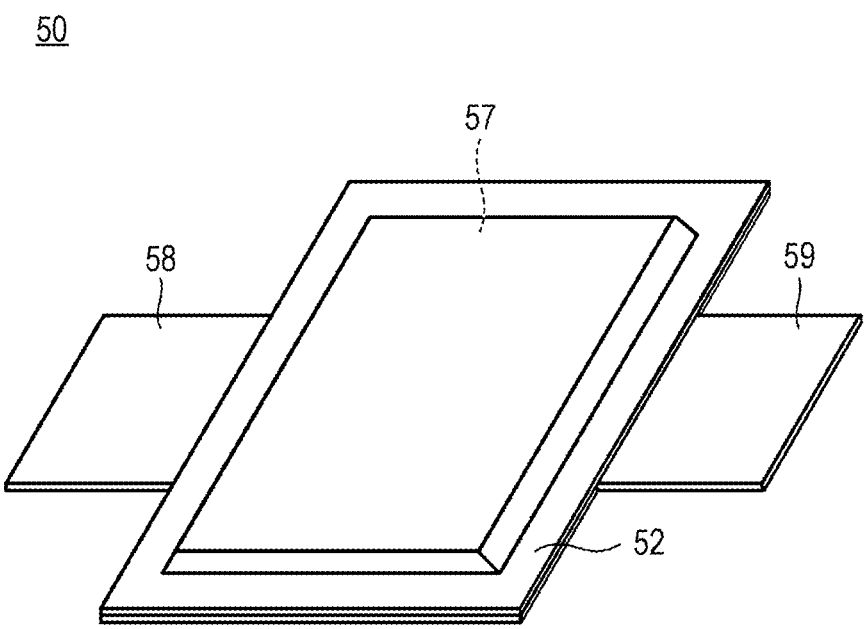
FIG. 7 is a perspective view illustrating an appearance of a flat lithium ion secondary battery, which is a representative embodiment of a laminate type secondary battery.

FIG. 7 is a perspective view illustrating an appearance of a flat lithium ion secondary battery which is a representative embodiment of a laminate type secondary battery.

As illustrated in FIG. 7, a flat laminate type secondary battery 50 has a rectangular flat shape, and a positive electrode tab 58 and a negative electrode tab 59 for extracting electric power are drawn out from both side portions thereof. A power generating element 57 is wrapped by a battery outer casing body (laminate film 52) of the laminate type secondary battery 50, a periphery thereof is thermally fused, and the power generating element 57 is sealed in a state where the positive electrode tab 58 and the negative electrode tab 59 are drawn out to the outside. The power generating element 57 corresponds to the power generating element 21 of the laminate type secondary battery 10a illustrated in FIG. 5 described above.

The lithium ion secondary battery is not limited to a laminate type flat shape. A wound type lithium ion secondary battery is not limited in particular, and, for example, may have a cylindrical shape or may have a rectangular flat shape obtained by deforming such a cylindrical shape. As for the lithium ion secondary battery having the cylindrical shape, there is no particular limitation, and, for example, a laminate film may be used or a conventional cylindrical can (metal can) may be used for an outer casing body thereof. Preferably, the power generating element is covered with an aluminum laminate film. According to this form, weight reduction can be achieved.

Furthermore, a way in which the tabs 58 and 59 illustrated in FIG. 7 are taken out is not limited in particular. There is no limitation to the configuration illustrated in FIG. 7, and for example, the positive electrode tab 58 and the negative electrode tab 59 may be taken out from the same side or the positive electrode tab 58 and the negative electrode tab 59 may be divided into a plurality of portions and taken out from each side. As for the wound type lithium ion battery, for example, a terminal may be formed by using a cylindrical can (metal can) instead of a tab.

[Assembled Battery]

An assembled battery is constituted by a plurality of batteries connected to one another. Specifically, an assembled battery is constituted by at least two batteries connected in series, in parallel, or both. By connecting the batteries in series and/or in parallel, capacitance and voltage can be freely adjusted.

A plurality of batteries may be connected in series or in parallel to form an attachable detachable compact assembled battery. Further, a plurality of such attachable and detachable compact assembled batteries may be connected in series or in parallel to form an assembled battery having a large capacity and a large output suitable for a power source for driving a vehicle and an auxiliary power source which require a high volume energy density and a high volume output density. How many batteries are connected to produce an assembled battery and how many stages of compact assembled batteries are laminated to produce a large-capacity assembled battery may be determined according to a battery capacity or output of a vehicle (electric vehicle) on which the assembled battery is to be mounted.

When the charging method according to the present invention is performed on an assembled battery, for example, the charging processing can be performed while measuring an internal resistance value of each of individual batteries (unit cells) constituting the assembled battery. With such a configuration, it is possible to perform the charging processing while separately monitoring occurrence of electrodeposition in each of the individual batteries (unit cells).

[Vehicle]

The non-aqueous electrolyte secondary battery of the present embodiment maintains a discharge capacity even when used for a long period of time and has good cycle characteristics. Furthermore, a volume energy density is high. In vehicle applications such as an electric vehicle, a hybrid electric vehicle, a fuel cell vehicle, and a hybrid fuel cell vehicle, a higher capacity, a larger size, and a longer life are required as compared with electric/portable electronic device applications. Therefore, the non-aqueous electrolyte secondary battery can be suitably used as a power source for a vehicle, for example, a power source for driving a vehicle or an auxiliary power source.

Specifically, a battery or an assembled battery constituted by a combination of a plurality of batteries can be mounted on a vehicle. According to the present invention, a long-life battery having excellent long-term reliability and output characteristics can be provided, and therefore mounting such a battery can provide a plug-in hybrid electric vehicle having a long EV traveling distance or an electric vehicle having a long one charge traveling distance. This is because a log-life and highly reliable automobile is provided when the battery or an assembled battery constituted by a combination of a plurality of such batteries is used, for example, for a hybrid vehicle, a fuel cell vehicle, or an electric vehicle (each encompasses a four-wheeled vehicle (a passenger car, a commercial car such as a truck or a bus, a light vehicle, and the like), a two-wheeled vehicle (motorcycle), and a three-wheeled vehicle) in the case of an automobile. However, the application is not limited to automobiles, and for example, the present invention can also be applied to various power supplies of other vehicles, for example, moving bodies such as a train and can also be used as a mounting power supply of an uninterruptible power supply device or the like.

REFERENCE SIGNS LIST

1 All-solid-state lithium ion secondary battery system
2 All-solid-state lithium ion secondary battery
3 Voltage sensor
4 Temperature sensor
5 Voltage current adjustment device
6 Current sensor
7 Impedance measuring device
8 Controller
9 External power supply
10a, 50 Laminate type secondary battery
10b Bipolar type secondary battery
11 Current collector 11' Positive electrode current collector
11" Negative electrode current collector
11a Outermost current collector on positive electrode side
11b Outermost current collector on negative electrode side
13 Positive electrode active material layer
15 Negative electrode active material layer
17 Electrolyte layer
19 Single battery layer
21, 57 Power generating element
23 Bipolar type electrode
25 Positive electrode current collecting plate (positive electrode tab)
27 Negative electrode current collecting plate (negative electrode tab)
29, 52 Laminate film
58 Positive electrode tab
59 Negative electrode tab
81 CPU
82 Memory

The invention claimed is:

1. An all-solid-state lithium ion secondary battery system comprising:
    an all-solid-state lithium ion secondary battery including a power generating element including
    a positive electrode including a positive electrode active material layer containing a positive electrode active material,
    a negative electrode including a negative electrode active material layer containing a negative electrode active material containing metal lithium, and
    a solid electrolyte layer interposed between the positive electrode active material layer and the negative electrode active material layer;
    a charger that charges the all-solid-state lithium ion secondary battery;
    an AC impedance measuring device that measures an AC impedance of the all-solid-state lithium ion secondary battery; and
    a controller that determines whether or not electrodeposition of metal lithium has occurred in the solid electrolyte layer based on a relationship between an amplitude of a response signal in a discharge direction and an amplitude of a response signal in a charge direction of an AC impedance measured by the AC impedance measuring device when the charger charges the all-solid-state lithium ion secondary battery.

2. The all-solid-state lithium ion secondary battery system according to claim 1, wherein
    the AC impedance measuring device applies an alternating current to the all-solid-state lithium ion secondary battery and acquires a response voltage as the response signal; and
    the controller determines that the electrodeposition has occurred in a case where at least one amplitude of the response voltage in the charge direction of the AC impedance becomes smaller than at least one amplitude of the response voltage in the discharge direction.

3. The all-solid-state lithium ion secondary battery system according to claim 2, wherein
    the controller determines that the electrodeposition has occurred in a case where an amplitude of the response voltage in the charge direction of the AC impedance becomes a predetermined ratio or less with respect to an amplitude of the response voltage in the discharge direction in a previous cycle.

4. The all-solid-state lithium ion secondary battery system according to claim 1, wherein
    the AC impedance measuring device applies an AC voltage to the all-solid-state lithium ion secondary battery and acquires a response current as the response signal; and
    the controller determines that the electrodeposition has occurred in a case where at least one amplitude of the response current in the charge direction of the AC impedance becomes larger than at least one amplitude of the response current in the discharge direction.

5. The all-solid-state lithium ion secondary battery system according to claim 4, wherein
    the controller determines that the electrodeposition has occurred in a case where an amplitude of the response current in the charge direction of the AC impedance becomes a predetermined ratio or more with respect to an amplitude of the response current in the discharge direction in a previous cycle.

6. The all-solid-state lithium ion secondary battery system according to claim 1, wherein
    the controller stops charging when it is determined that electrodeposition of metal lithium has occurred in the solid electrolyte layer.

7. The all-solid-state lithium ion secondary battery system according to claim 1, wherein
    in a case where it is determined that electrodeposition of metal lithium has occurred in the solid electrolyte layer, the controller changes a condition of the charging so that the electrodeposition becomes less likely to occur.

8. The all-solid-state lithium ion secondary battery system according to claim 6, wherein
    in a case where it is determined that electrodeposition of metal lithium has occurred in the solid electrolyte layer, the controller stops the charging and then discharges the all-solid-state lithium ion secondary battery with a current smaller than a charging current for the charging.

9. A charging device for charging an all-solid-state lithium ion secondary battery including a negative electrode active material layer containing a negative electrode active material containing metal lithium, the charging device comprising:
    a charger that charges the all-solid-state lithium ion secondary battery;
    an AC impedance measuring device that measures an AC impedance of the all-solid-state lithium ion secondary battery; and
    a controller that determines whether or not electrodeposition of metal lithium has occurred in a solid electrolyte layer based on a relationship between an amplitude of a response signal in a discharge direction and an amplitude of a response signal in a charge direction of an AC impedance measured by the AC impedance measuring device when the charger charges the all-solid-state lithium ion secondary battery.

* * * * *